(12) United States Patent
Yoon et al.

(10) Patent No.: US 11,349,034 B2
(45) Date of Patent: May 31, 2022

(54) PROTRUDING GATE TRANSISTOR AND METHOD OF PRODUCING SAME

(71) Applicant: XIA TAI XIN SEMICONDUCTOR (QING DAO) LTD., Qingdao (CN)

(72) Inventors: Kyeongill Yoon, Singapore (SG); Yongchul Oh, Singapore (SG)

(73) Assignee: XIA TAI XIN SEMICONDUCTOR (QING DAO) LTD., Qingdao (CN)

(*) Notice: Subject to any disclaimer, the term of this patent is extended or adjusted under 35 U.S.C. 154(b) by 7 days.

(21) Appl. No.: 16/679,343

(22) Filed: Nov. 11, 2019

(65) Prior Publication Data
US 2021/0143283 A1    May 13, 2021

(51) Int. Cl.
*H01L 29/66*    (2006.01)
*H01L 29/786*    (2006.01)
*H01L 29/423*    (2006.01)
*H01L 29/78*    (2006.01)

(52) U.S. Cl.
CPC .. *H01L 29/78696* (2013.01); *H01L 29/42376* (2013.01); *H01L 29/6656* (2013.01); *H01L 29/66181* (2013.01); *H01L 29/66765* (2013.01); *H01L 29/7851* (2013.01); *H01L 29/78639* (2013.01)

(58) Field of Classification Search
None
See application file for complete search history.

(56) References Cited

U.S. PATENT DOCUMENTS

| | | | | |
|---|---|---|---|---|
| 10,727,323 | B2 * | 7/2020 | Li | H01L 29/7391 |
| 2006/0049404 | A1 * | 3/2006 | Park | H01L 29/78696 |
| | | | | 257/E29.291 |
| 2013/0299834 | A1 * | 11/2013 | Lee | H01L 29/7827 |
| | | | | 257/66 |
| 2019/0214487 | A1 * | 7/2019 | Li | H01L 29/66977 |
| 2019/0237580 | A1 * | 8/2019 | Bi | H01L 27/1211 |
| 2019/0288091 | A1 * | 9/2019 | Dennard | H01L 29/66545 |
| 2020/0006575 | A1 * | 1/2020 | Dewey | H01L 29/785 |

* cited by examiner

*Primary Examiner* — Ali Naraghi
(74) *Attorney, Agent, or Firm* — ScienBiziP, P.C.

(57) ABSTRACT

A structure of a protruding gate transistor is disclosed. The protruding gate transistor comprising a substrate, a source region, a drain region, a channel extension anchor, a channel layer, and gate structure. The gate structure comprising a gate insulator layer, and a gate conductor layer. The channel layer is formed to be protruding from the substrate to extend the length of the channel of the protruding gate transistor and alleviate from channel length modulation.

17 Claims, 7 Drawing Sheets

US 11,349,034 B2

PROTRUDING GATE TRANSISTOR AND METHOD OF PRODUCING SAME

BACKGROUND

1. Field of the Invention

The present disclosure generally relates to semiconductor transistor, and more particularly, a semiconductor transistor having a protruding gate.

2. Description of the Related Art

As the size of the semiconductor technology goes down, problems from the short channel effects becomes more prominent in designing of integrated circuit. The short channel effects include channel length modulation (CLM), which is a shortening of the uninverted length of the channel region with the increase in drain voltage. Thus, there is a need to prevent/alleviate CLM issues.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
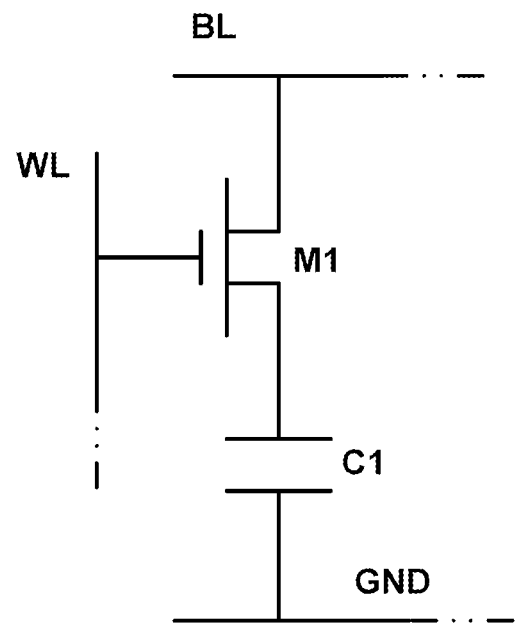
FIG. 1 illustrates a schematic diagram of a memory cell according to some embodiments of the present disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a schematic diagram of a memory cell according to some embodiments of the present disclosure. The memory cell includes a transistor M1 and a capacitor C1. The transistor M1 has a first terminal coupled to a bit line BL, a second terminal coupled to the capacitor C1, and a control terminal coupled to a word line WL. The capacitor C1 has a first terminal coupled to the transistor M1 and a second terminal coupled to a ground GND terminal. In some embodiments, the memory cell of FIG. 1 may be a dynamic random-access memory (DRAM) cell. Each memory cell may store one bit of data. The capacitor C1 may be charged or discharged to represent two values of a bit. The value may be taken as "1" or "0".

Figure 2:
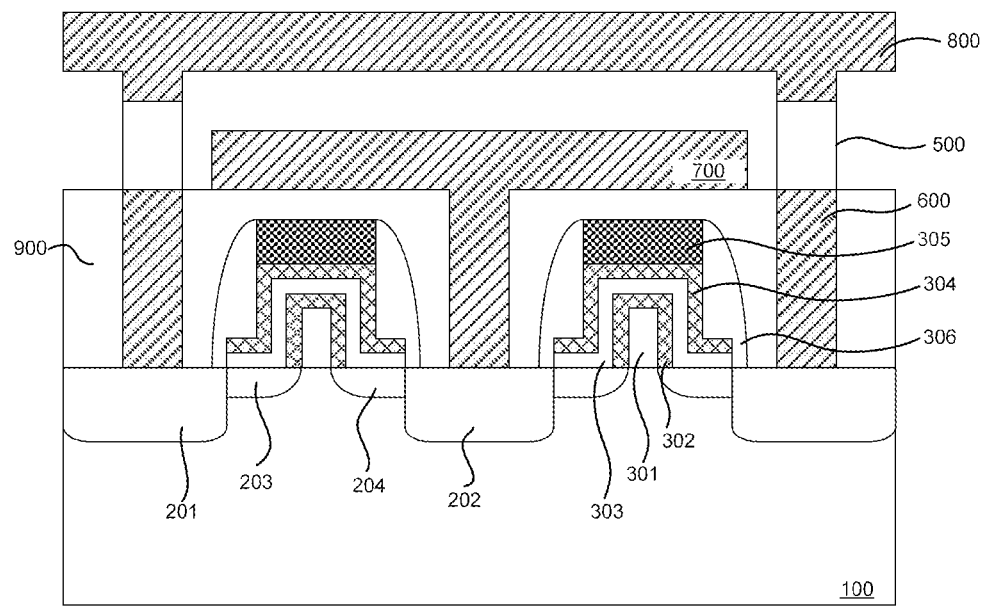
FIG. 2 illustrates a cross sectional view of a memory cell according to some embodiments of the present disclosure.

FIG. 2 illustrates a cross sectional view of a memory cell according to some embodiments of the present disclosure. In some embodiments, the memory cell comprises a protruding gate transistor structure and a capacitor structure 500. In some embodiments, the protruding gate transistor structure includes a substrate 100, a source region, a drain region, a channel extension anchor 301, a channel layer 302, and gate structure (comprising components that includes, e.g., 303, 304, 305, 306).

In the illustrated embodiment, the source region and the drain region are formed within the substrate 100. In some embodiments, the source region has a heavily doped region 201 and a lightly doped region 203. Likewise, the drain region has a heavily doped region 202 and a lightly doped region 204. To prevent punch through in between the lightly doped regions 203 and 204, an anti-punch through material/region (e.g., a punch through barrier 1000 shown in FIG. 8) may be formed between the lightly doped regions 203 and 204. The anti-punch through material may be a doped region within the substrate 100 that has a dopant type different from the lightly doped regions 203 and 204.

Figure 8:
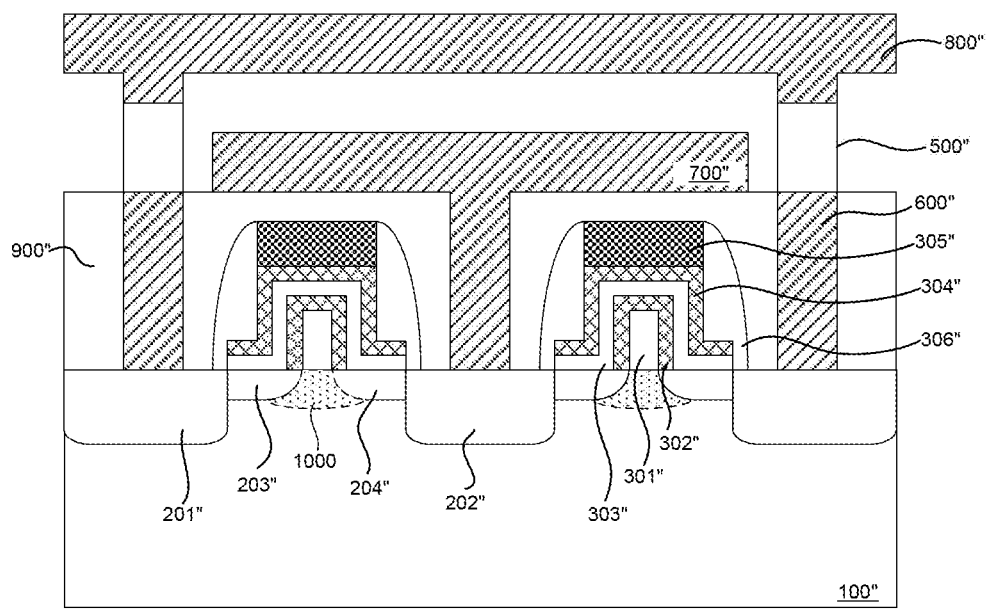
FIG. 8 illustrates a cross sectional view of a memory cell according to some embodiments of the present disclosure.

In some embodiments, the punch through barrier 1000 in FIG. 8 is not limited to being formed only within the substrate 100". The punch through barrier 1000 may further be formed within the channel extension anchor 301" of the memory cell. Furthermore, in some embodiments, the punch through barrier 1000 may be formed first on the substrate 100". In some embodiments, when the punch through barrier 1000 is formed first on the substrate 100", the substrate 100" is etched to form the channel extension anchor 301". In this way, the channel extension anchor 301" is a fin formed on the substrate 100" and has the channel extension anchor 301" doped in the same way as the punch through barrier 1000.

The channel extension anchor 301 is disposed between the source region and the drain region. The channel layer 302 is conformally arranged over the channel extension anchor 301 and laterally extending across the source and drain regions on the opposite sides of the anchor. In the illustrated embodiment, the channel layer 302 forms an inverted U sectional shape. The ends of the channel layer 302 closest to the substrate 100 is disposed over (e.g., overlaps) a portion of the drain region and a portion of the source region. Suitable material for the channel layer 302 includes, but is not limited to, conductive material such as poly silicon. The gate structure is formed on and extending away from a surface of the substrate 100. The gate structure includes a gate insulator layer 303, and a gate conductor layer 304. The gate insulator layer 303 covers the channel layer 302. The gate conductor layer 304 covers the gate insulator layer 303. The gate insulator layer 303 and the gate conductor layer 304 forms an omega (Ω) sectional shape.

The flat surface of the flanges of the gate insulator layer 303 and the gate conductor layer 304 are correspondingly disposed over the lightly doped regions 203, 204 of the drain region and the source region. In some embodiments, the ends of the gate insulator layer 303 and the gate conductor layer 304 is aligned with each other. The ends of the gate insulator layer 303 and the gate conductor layer 304 marks the area on the substrate 100 where a periphery of the heavily doped regions 201, 202 is formed.

A material of the channel extension anchor 301 includes an insulator such as oxide or nitride. In some embodiments, a material of the channel layer 302 includes, but is not limited to, silicon like substance other than poly silicon. For instance, mono-layers or ultra thin layers of 2D transition metal dichalcogenides (TMDs) appear to have outstanding conductive properties for the material of the channel layer 302. These layered materials exhibit a diverse range of electrical properties, varying from indirect band gap in the bulk to direct band gap at thin-layer thicknesses. Likewise, 2-D films of certain elements, such as silicon, germanium, and tin, behave like topological insulators with possible room-temperature superconducting properties at the edges thereof. For example, silicene, germanene and stannene are the 2-D allotrope of silicon (Si), germanium (Ge), and tin (Sn), respectively.

A material of the gate insulator layer 303 may include, but is not limited to, oxide and nitride oxide. A material of the gate conductor layer 304 includes, but is not limited to, doped poly silicon and tungsten. A material of the gate conductor layer 304 includes, but is not limited to, poly silicon.

In some embodiments, the gate structure further includes a metal cap 305. The metal cap 305 disposed on the gate conductor layer 304. In some embodiments, the metal cap 305 covers the second electrode layer. In some embodiments, the metal cap 305 is disposed only on a top surface of the gate structure. Suitable material for the metal cap 305 may include, but not limited to, Tungsten (W). In some embodiments, a memory cell is coupled to a word line through electrical coupling through the metal cap 305.

Figure 7:
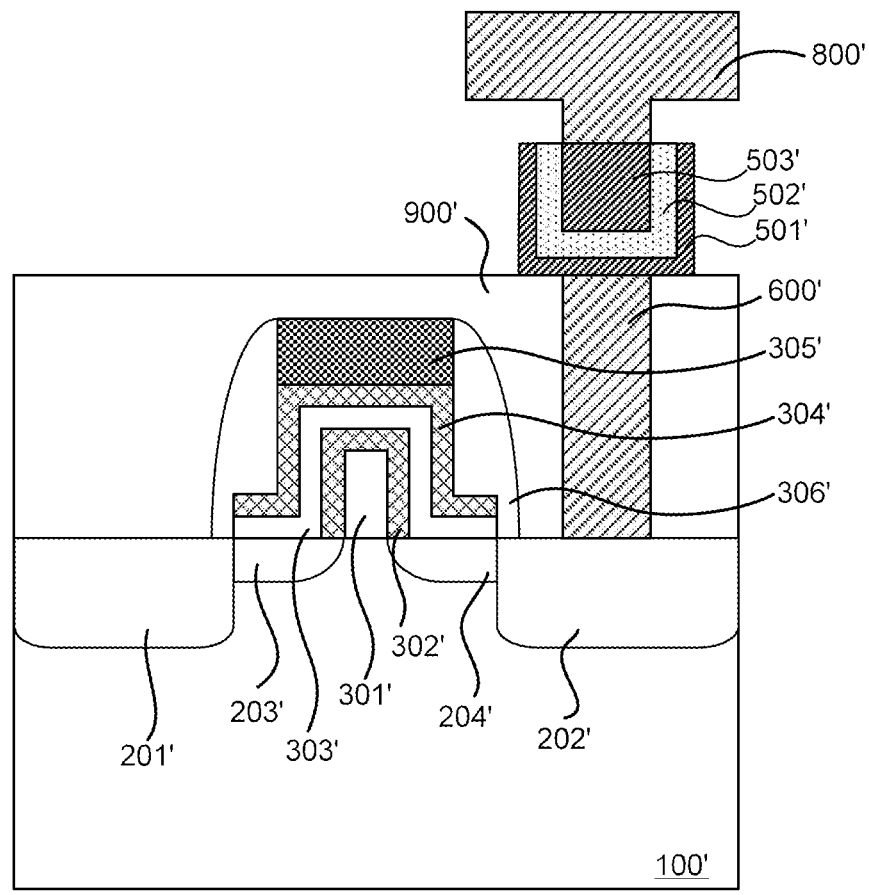
FIG. 7 illustrates a cross sectional view of a capacitor structure according to some embodiments of the present disclosure.

In some embodiments, the memory cell further comprises a contact 600, a capacitor structure 500, and an insulator (interlayer dielectric) layer 900. The contact 600 is disposed on the surface of the surface of the substrate 100. The capacitor structure 500 is electrically coupled to the source/drain region through the contact 600. The insulator layer 900 is formed on the surface of the substrate 100. The insulator layer 900 covers the gate structure and a lateral sidewall of the contact 600. The capacitor structure 500 is disposed on a surface of the insulating layer 900. In some embodiments, the capacitor structure 500 comprises a cylindrical structure. Referring ahead to FIG. 7, the capacitor structure 500 comprises a storage layer 501, a barrier layer 502, and a reference layer 503. The storage layer 501 is disposed on the surface of the insulator layer 900. The barrier layer 502 is disposed on the storage layer 501. In the illustrated example, the reference layer 503 is disposed on the barrier layer 502. The charge in the memory cell is stored in the capacitor structure. Thus, there is no need to retain charge within the channel layer 302 (e.g., unlike some devices that employ a floating gate).

Figure 3:
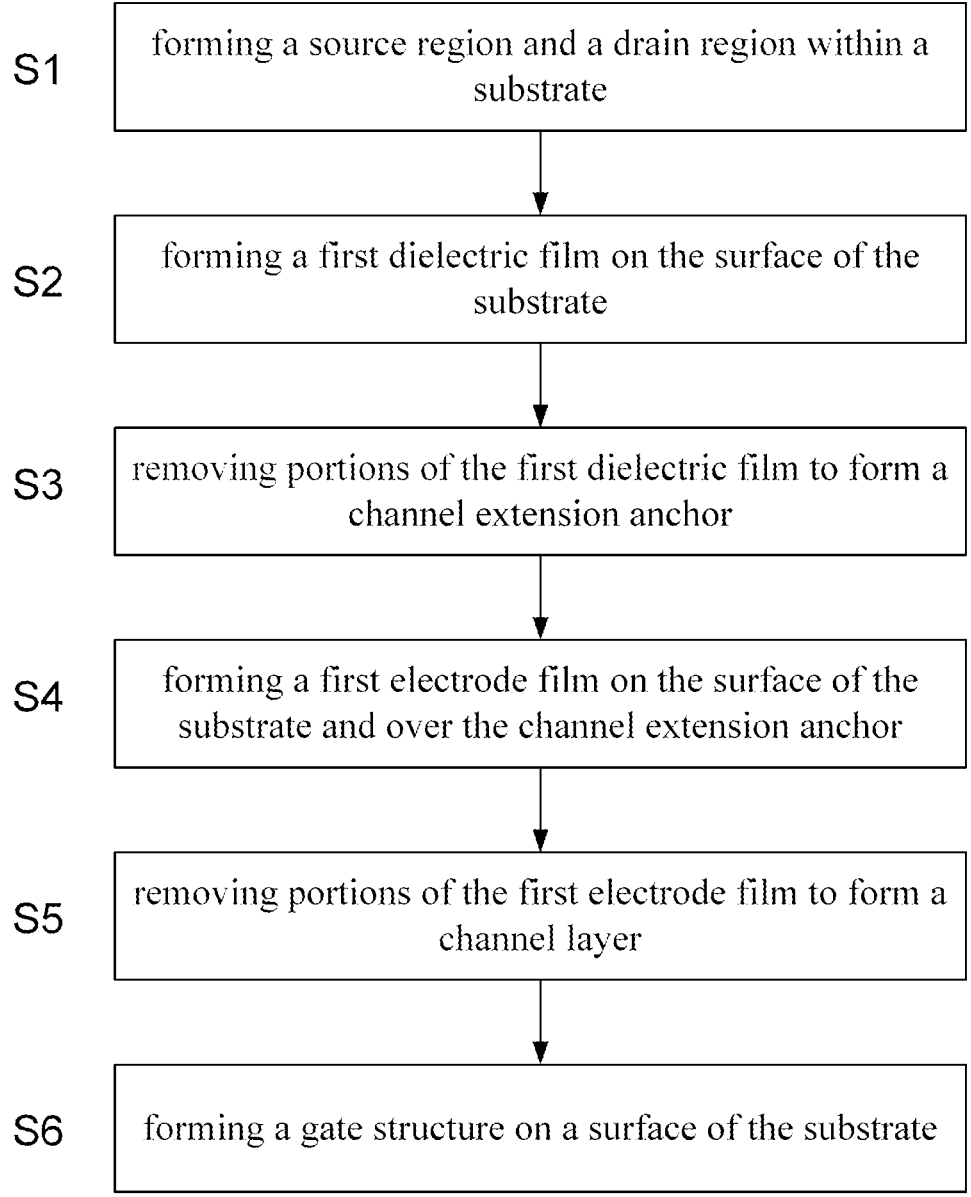
FIG. 3 illustrates a flowchart of a method for forming a memory cell according to some embodiments of the present disclosure.

FIG. 3 illustrates a flowchart of a method for forming a memory cell according to some embodiments of the present disclosure. The method includes forming a source region and a drain region within a substrate (S1), forming a first dielectric film on the surface of the substrate (S2), removing portions of the first dielectric film to form a channel extension anchor (S3), forming a first electrode film on the surface of the substrate and over the channel extension anchor (S4), removing portions of the first electrode film to form a channel layer (S5), and forming a gate structure on a surface of the substrate (S6). The gate structure is disposed between the source structure and the drain structure. In some embodiments, a material used to form the channel layer and the gate conductor layer includes poly silicon. In some embodiments, the method of forming the memory cell further includes forming a spacer on a lateral sidewall of the gate structure and forming an insulator layer on the surface of the substrate to cover the gate structure. In some embodiments, the channel layer forms an inverted U sectional shape. The gate insulator layer and the gate conductor layer forms an omega (Ω) sectional shape.

Figure 4A:
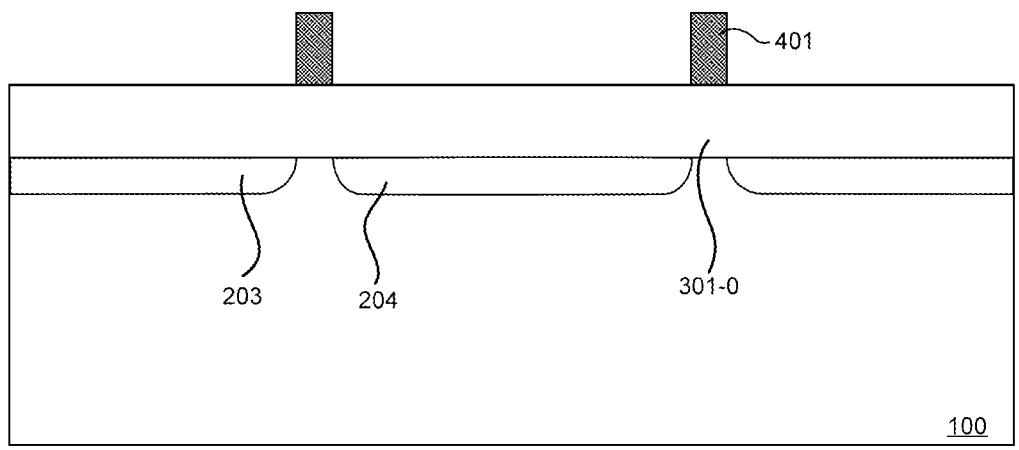
FIG. 4A-4E illustrates cross sectional views of a memory cell during fabrication according to some embodiments of the present disclosure.
Figure 4B:
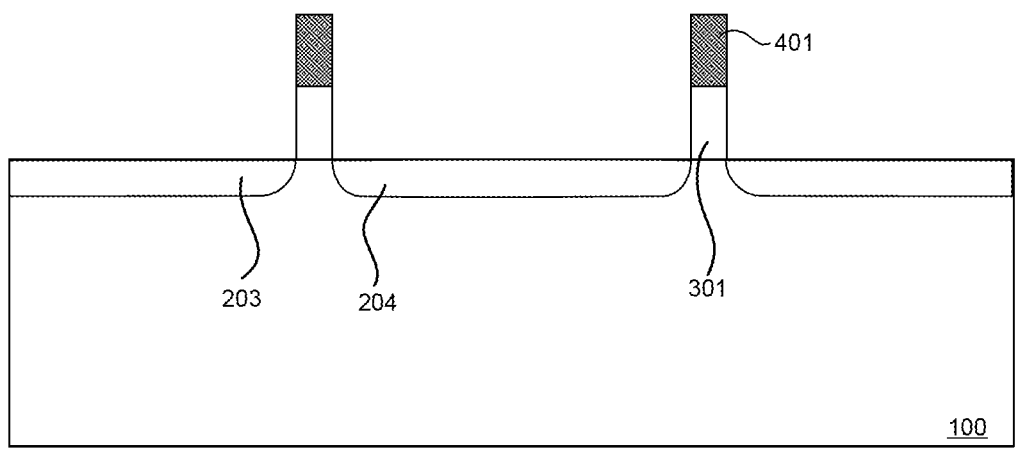
Figure 4C:
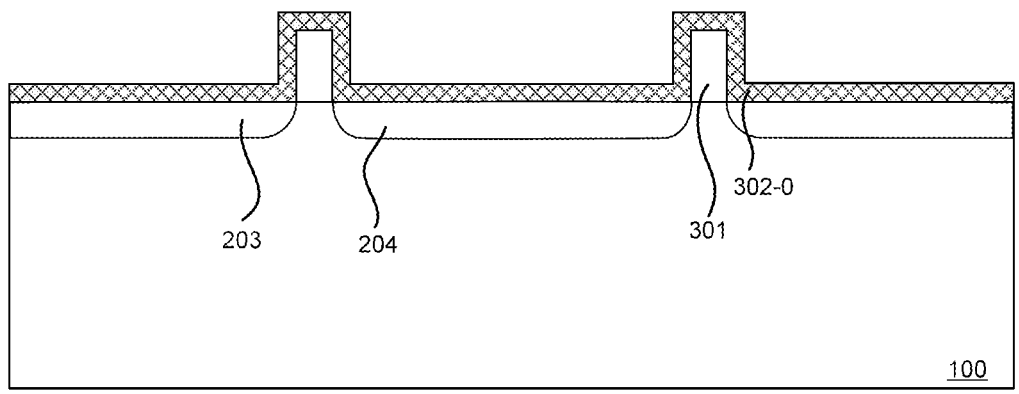

FIG. 4A-4E illustrates cross sectional views of a memory cell during fabrication according to some embodiments of the present disclosure. As shown in FIG. 4A, a first dielectric film 301-0 is formed on the substrate 100. The first dielectric film 301-0 is formed to cover the entire surface of the substrate 100. A photoresist layer 401 is formed on the first dielectric film 301-0 and shaped according to the pattern of the channel extension anchor 301. The first dielectric film 301-0 is etched according to the pattern of the photoresist layer 401. The remaining portion of the first dielectric film 301-0 after etching forms the channel extension anchor 301, as shown in FIG. 4B.

Figure 4D:
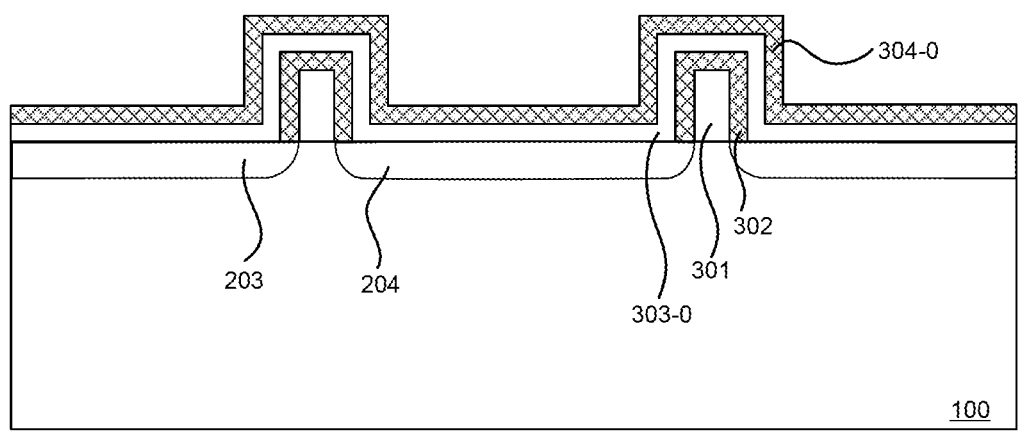

Afterwards, a first electrode film 302-0 on the substrate 100 and over the channel extension anchor 301. The first electrode film 302-0 may be substantially conformally formed over the channel extension anchor 301 and the surface of the substrate 100. The first electrode film 302-0 may be selectively etched such that only the portion of the first electrode film 302-0 conformally formed over the channel extension anchor 301 shall remain to form the channel layer 302, as shown in FIG. 4D. The channel layer 302 may have substantially uniform thickness along the surfaces of the channel extension anchor 301.

Figure 5:
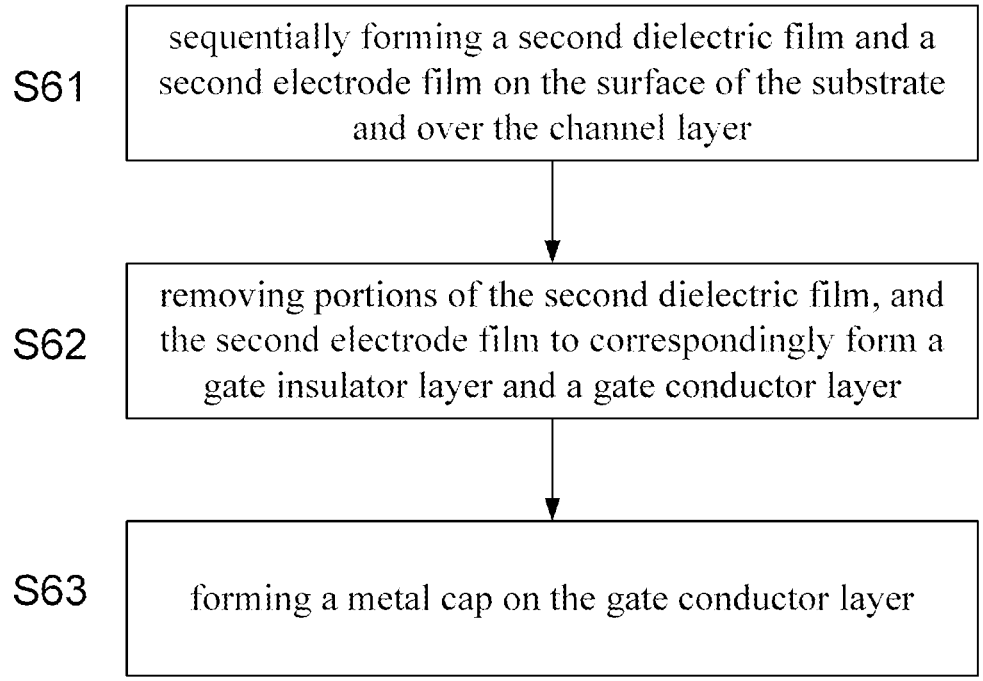
FIG. 5 illustrates a flowchart of a method for forming a gate structure according to some embodiments of the present disclosure.

FIG. 5 illustrates a flowchart of a method for forming a gate structure according to some embodiments of the present disclosure. In some embodiments, the method of forming the gate structure includes sequentially forming a second dielectric film and a second electrode film on the surface of the substrate and over the channel layer (S61), removing portions of the second dielectric film, and the second electrode film to correspondingly form a gate insulator layer and a gate conductor layer (S62), and forming a metal cap on the gate conductor layer (S63). In some embodiments, the gate conductor layer forms an omega shape and the hole of the sacrificial structure exposes a top portion of the omega shape. In some other embodiments, the gate conductor layer forms an omega shape and the metal cap covers a top portion, a side portion, and a flange portion of the omega shape. A material used to form the metal cap includes Tungsten (W).

Figure 4E:
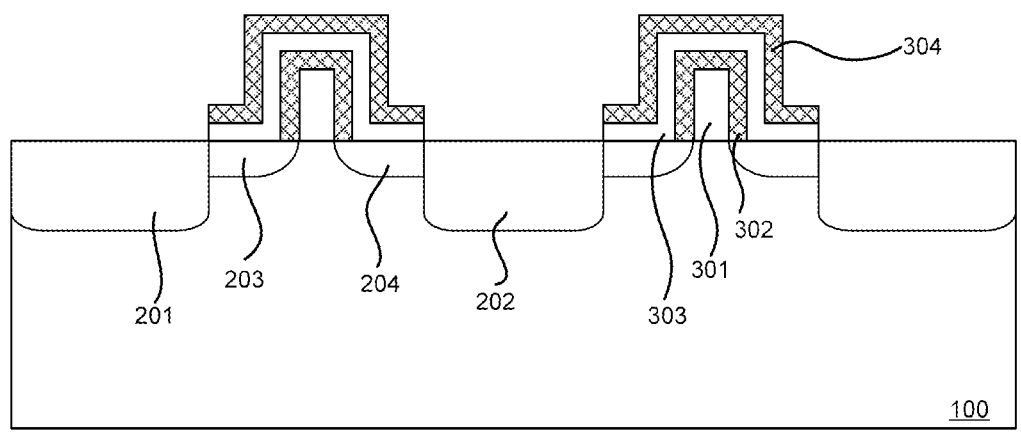

As shown in FIG. 4D, a second dielectric film 303-0 and a second electrode film 304-0 is sequentially formed on the surface of the substrate. The second dielectric film 303-0 and the second electrode film 304-0 may be substantially conformally formed over the channel layer 302. In some embodiments, as shown in FIG. 4E, a portion of the second dielectric film 303-0 and the second electrode film 304-0 are removed to correspondingly form the gate insulator layer 303 and the gate conductor layer 304.

Figure 6A:
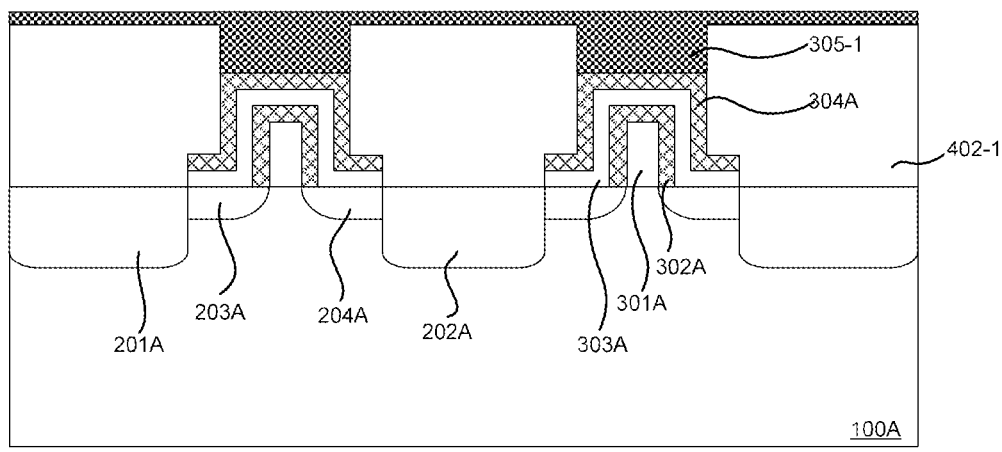
FIG. 6A-6C illustrates cross sectional views of a memory cell during fabrication of a metal cap according to some embodiments of the present disclosure.

FIG. 6A illustrates cross sectional view of a memory cell during fabrication of a metal cap according to some embodiments of the present disclosure. In some embodiments, the method of forming the metal cap includes forming a sacrificial structure 402-1 over the surface of the substrate 100A, forming a hole on the sacrificial structure 402-1 to expose a portion of the gate conductor layer 304A, disposing the metal cap in the hole of the sacrificial structure 402-1, and removing the sacrificial structure 402-1. As shown in FIG. 6A, only a surface of the gate conductor layer 304A farthest from the substrate 100 is exposed through the sacrificial structure 402-1. A conductive film (e.g., metal film) 305-1 is then formed on the substrate 100 to fill the hole in the sacrificial structure 402-1. The metal film 305-1 may be formed through electroplating. The metal film 305-1 may flow out of the sacrificial structure 402-1 that forms a single metal film 305-1. A portion of the metal film 305-1 formed on the surface of the sacrificial structure 402-1 may be removed to form a metal cap. The portion of the metal film 305-1 may be removed using process such as planarization. The sacrificial structure 402-1 may be removed after the metal cap is formed. A material used to form the metal cap may include Tungsten (W).

Figure 6B:
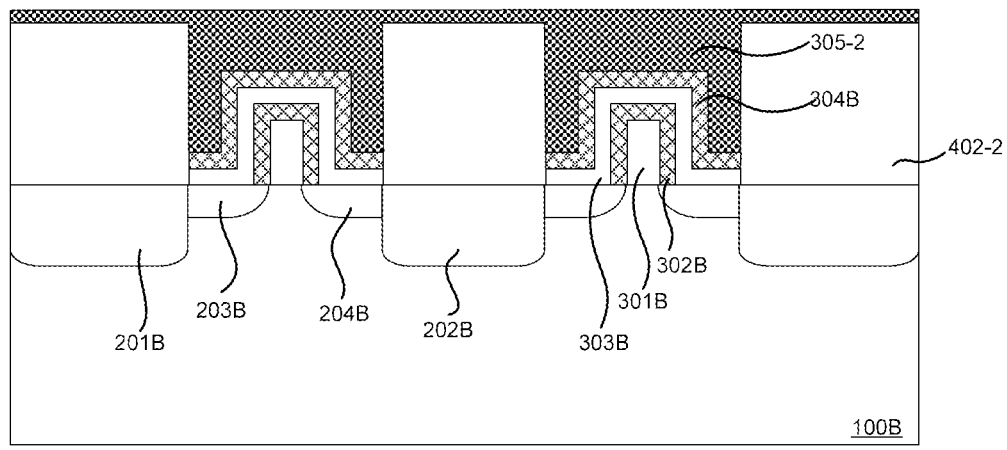

FIG. 6B illustrates cross sectional view of a memory cell during fabrication of a metal cap according to some embodiments of the present disclosure. In some embodiments, the metal cap covers the entirety of the surface of the omega ($\Omega$) sectional shaped gate conductor layer 304. As shown in FIG. 6B, only a surface of the gate conductor layer 304B farthest from the substrate 100B is exposed through the sacrificial structure 402-2. A metal film 305-2 is then formed on the substrate 100 to fill in the hole of the sacrificial structure 402-2. The opening area of the hole of the sacrificial structure 402-2 shown in FIG. 6B is greater than the opening area of the hole of the sacrificial structure 402-1 shown in FIG. 6A. The metal film 305-2 may be formed through electroplating. The metal film 305-2 may flow out of the sacrificial structure 402-2 that forms a single metal film 305-2. A portion of the metal film 305-1 formed on the surface of the sacrificial structure 402-2 may be removed to form a metal cap. The portion of the metal film 305-2 may be removed using process such as planarization. In comparison, the planar area of the metal cap formed using the process illustrated in FIG. 6A is less than the planar area of the metal cap formed using the process illustrated in FIG. 6B. In this way, the volume of the metal cap illustrated in FIG. 6A is less than the volume of the metal cap illustrated in FIG. 6B. The sacrificial structure 402-2 may be removed after the metal cap is formed.

Figure 6C:
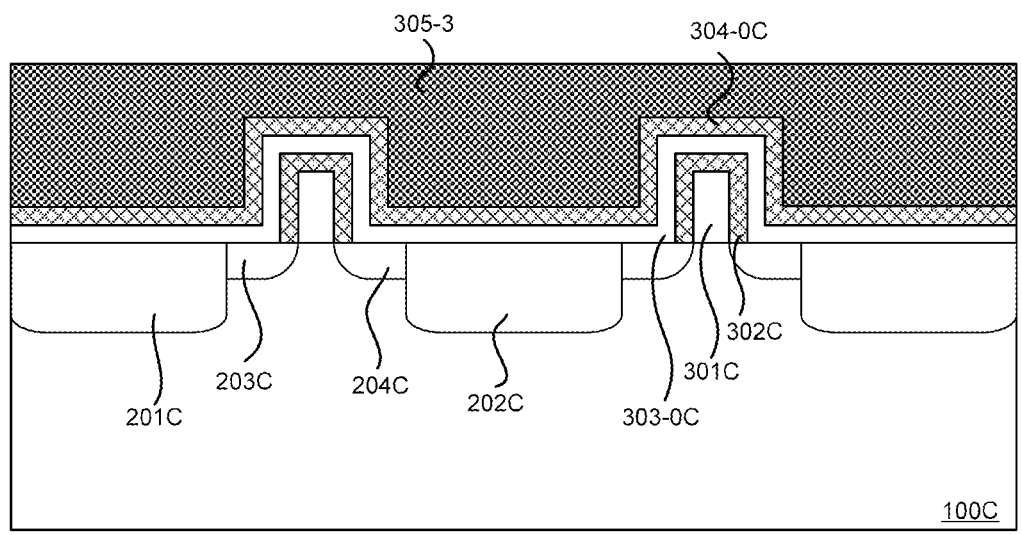

FIG. 6C illustrates cross sectional view of a memory cell during fabrication of a metal cap according to some embodiments of the present disclosure. In some other embodiments, the method of forming the metal cap includes forming a metal film 305-3 on the second electrode film 304-0C, and removing portions of the metal film 305-3 simultaneously with removing portions of the second dielectric film 303-0C and the second electrode film 304-0C to form the metal cap. In an exemplary embodiment, after the process shown in FIG. 4D, the metal film 305-3 is formed on the second electrode film 304-0C. The metal film 305-3 may or may not be substantially conformal to the surface of the second electrode film 304-0C, depending on the process used to form the metal film 305-3. In the same way as the exemplary embodiment shown in FIG. 6B, the metal cap covers the entirety of the surface of the omega ($\Omega$) sectional shaped gate conductor layer.

In some embodiments, forming the source region includes forming a heavily doped region and forming a lightly doped region after forming the heavily doped region. A distance between the lightly doped region of the drain region and the lightly doped region of the source region may be the same as the width of the channel extension anchor. In some embodiments, the lightly doped region of the drain region and the lightly doped region of the source region are directly coupled to the channel layer.

In some other embodiments, forming the drain region includes forming a lightly doped region and forming a heavily doped region after forming the lightly doped region. The source region and drain region may be formed simultaneously. In some embodiments, the lightly doped region of the source region and the drain region may be formed within the substrate before the channel extension anchor is formed. In some embodiments, the heavily doped region 201, 202 of the source region and the drain region may be formed after forming the gate insulator layer 303 and the gate conductor layer 304, as shown in FIG. 4E.

FIG. 7 illustrates a cross sectional view of a capacitor structure according to some embodiments of the present disclosure. In some embodiments, the capacitor structure of a memory cell is a cylindrical capacitor. The capacitor structure comprises a storage layer 501', a barrier layer 502', a reference layer 503'. The storage layer 501' forms a glass shape. The storage layer 501' may have a pipe body and a cover layer covers one side of the opening of the pipe body. The cover layer being disposed on the contact 600' and the insulator layer 900'. The barrier layer 502' is disposed within the storage layer 501'. In the same way as the storage layer 501', the barrier layer 502' may have a pipe body and a cover layer covers one side of the opening of the pipe body. The barrier layer 502' is in contact with the storage layer 501'. The reference layer 503' may be formed to fill the pipe body of the barrier layer 502'. In some embodiments, the material for the storage layer 501' includes titanium nitride (TiN). In some embodiments, the material for the barrier layer 502' includes high K material such as zirconium oxide ($ZrO_2$). In some embodiments, the material for the reference layer 503' includes titanium nitride (TiN).

Accordingly, one aspect of the instant disclosure provides a protruding gate transistor structure, which comprises a substrate, a source region and a drain region formed within the substrate, a channel extension anchor disposed between the source region and the drain region, a channel layer conformally covering the channel extension anchor, and a gate structure formed on and extending away from a surface of the substrate. The gate structure comprises a gate insulator layer covering the channel layer, a gate conductor layer covering the gate insulator layer, and a metal cap disposed on the gate conductor layer.

In some embodiments, the metal cap covers the gate conductor layer.

In some embodiments, the metal cap disposed only on a top surface of the gate structure.

In some embodiments, the channel layer forms an inverted U sectional shape and the gate insulator layer and the gate conductor layer forms an omega ($\Omega$) sectional shape.

In some embodiments, wherein a material for the metal cap includes Tungsten (W) and a material for the channel layer and the gate conductor layer includes poly silicon.

In some embodiments, the source region comprises a heavily doped region and a lightly doped region and the drain region comprises a heavily doped region and a lightly doped region.

Accordingly, another aspect of the instant disclosure provides a memory including a protruding gate transistor structure, which comprises a substrate, a source region and a drain region formed within the substrate, a channel extension anchor disposed between the source region and the drain region, a channel layer conformally covering the channel extension anchor, a gate structure formed on and extending away from a surface of the substrate, a contact disposed on the surface of the surface of the substrate, a capacitor structure electrically coupled to the source region through the contact, and an insulator layer formed on the surface of the substrate. The gate structure comprises a gate insulator layer covering the channel layer, a gate conductor layer covering the gate insulator layer, and a metal cap disposed on the gate conductor layer. The insulator layer covers the gate structure and a lateral sidewall of the contact. The capacitor structure is disposed on a surface of the insulating layer.

In some embodiments, the metal cap covering the gate conductor layer.

In some embodiments, the metal cap disposed only on a top surface of the gate structure.

In some embodiments, the channel layer forms an inverted U sectional shape and the gate insulator layer and the gate conductor layer forms an omega ($\Omega$) sectional shape.

In some embodiments, a material for the metal cap includes Tungsten (W) and a material for the channel layer and the gate conductor layer includes poly silicon.

In some embodiments, the source region comprises a heavily doped region and a lightly doped region and the drain region comprises a heavily doped region and a lightly doped region.

In some embodiments, the capacitor comprises a storage layer disposed on the surface of the insulator layer, a barrier layer disposed on the storage layer, and a reference layer disposed on the barrier layer.

Accordingly, yet another aspect of the instant disclosure provides a method of forming a protruding gate transistor structure, which comprises forming a source region and a drain region within a substrate; forming a first dielectric film on the surface of the substrate; removing portions of the first dielectric film to form a channel extension anchor; forming a first electrode film on the surface of the substrate and over the channel extension anchor; removing portions of the first electrode film to form a channel layer; and forming a gate structure on a surface of the substrate between the source structure and the drain structure. Forming the gate structure comprises sequentially forming a second dielectric film, and a second electrode film on the surface of the substrate and over the channel layer; removing portions of the second dielectric film, and the second electrode film to correspondingly form a gate insulator layer, and a gate conductor layer; and forming a metal cap on the gate conductor layer.

In some embodiments, forming the metal cap on the gate conductor layer comprises forming a sacrificial structure on the surface of the substrate; forming a hole on the sacrificial structure to expose a portion of the gate conductor layer, the gate conductor layer forms an omega shape and the hole of the sacrificial structure exposes a top portion of the omega shape; disposing the metal cap (305) in the hole of the sacrificial structure; and removing the sacrificial structure.

In some embodiments, forming the metal cap on the gate conductor layer comprises forming a metal film on the second electrode film; and removing portions of the metal film simultaneously with removing portions of the second dielectric film, and the second electrode film to form the metal cap. The gate conductor layer forms an omega shape and the metal cap covers a top portion, a side portion, and a flange portion of the omega shape.

In some embodiments, the method further comprises forming a spacer on a lateral sidewall of the gate structure; and forming an insulator layer on the surface of the substrate to cover the gate structure.

In some embodiments, a material for the metal cap includes Tungsten (W) and a material for the channel layer and gate conductor layer includes poly silicon.

In some embodiments, forming the source region comprises forming a heavily doped region and forming a lightly doped region after forming the heavily doped region, and forming the drain region comprises forming a heavily doped region and forming a lightly doped region after forming the heavily doped region.

In some embodiments, the channel layer forms an inverted U sectional shape and the gate insulator layer and the gate conductor layer forms an omega ($\Omega$) sectional shape.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A protruding gate transistor structure, comprising:
   a substrate;
   a source region and a drain region formed within the substrate, each of the source region and the drain region including a heavily doped region and a slightly doped region; and
   a channel extension anchor disposed between the source region and the drain region;
   a channel layer conformally covering the channel extension anchor;
   a gate structure formed on and extending away from a surface of the substrate, the gate structure comprising:
   a gate insulator layer covering the channel layer;
   a gate conductor layer covering the gate insulator layer; and
   a metal cap disposed on the gate conductor layer;
   wherein the channel layer is between the channel extension anchor and the gate structure; the gate structure covers a surface of the channel layer away from the channel extension anchor; the channel layer forms an inverted U sectional shape; each of the gate insulator layer and the gate conductor layer comprises a top portion, a side portion connected to the top portions, and a flange portion protruding from the side portion, the flange of the gate conductor layer is disposed on and parallel to the flange of the gate conductor layer, a flat surface of the flange of the gate conductor layer is disposed on the slightly doped region, and the gate insulator layer and the gate conductor layer form an omega ($\Omega$) sectional shape.

2. The structure of claim 1, wherein the metal cap covers the gate conductor layer.

3. The structure of claim 1, wherein the metal cap disposed only on a top surface of the gate structure.

4. The structure of claim 1, wherein a material for the metal cap includes Tungsten (W) and a material for the channel layer and the gate conductor layer includes poly silicon.

5. The structure of claim 1, wherein the source region comprises a heavily doped region and a lightly doped region and the drain region comprises a heavily doped region and a lightly doped region.

6. The protruding gate transistor structure of claim 1, wherein a punch through barrier is formed between the lightly doped region of the source region and the lightly doped region of the drain region; the punch through barrier is a doped region within the substrate that has a dope type different from the lightly doped region of the source region and the lightly doped region of the drain region.

7. The protruding gate transistor structure of claim 6, wherein the punch through barrier is further formed within the channel extension anchor.

8. The protruding gate transistor structure of claim 1, wherein ends of the gate insulator layer and the gate conductor layer is aligned with each other; the ends of the gate insulator layer and the gate conductor layer marks the area on the substrate where a periphery of the heavily doped region of the source region and the heavily doped region of the drain region is formed.

9. A memory including a protruding gate transistor structure, comprising:
   a substrate;
   a source region and a drain region formed within the substrate, each of the source region and the drain region including a heavily doped region and a slightly doped region;
   a channel extension anchor disposed between the source region and the drain region;
   a channel layer conformally covering the channel extension anchor;
   a gate structure formed on and extending away from a surface of the substrate, the gate structure comprising:
   a gate insulator layer covering the channel layer;
   a gate conductor layer covering the gate insulator layer; and
   a metal cap disposed on the gate conductor layer;
   a contact disposed on the surface of the surface of the substrate;
   a capacitor structure electrically coupled to the source region through the contact; and
   an insulator layer formed on the surface of the substrate, the insulator layer covering the gate structure and a lateral sidewall of the contact, the capacitor structure disposed on a surface of the insulating layer;
   wherein the channel layer is between the channel extension anchor and the gate structure; the gate structure covers a surface of the channel layer away from the channel extension anchor; the channel layer forms an inverted U sectional shape; each of the gate insulator layer and the gate conductor layer comprises a top portion, a side portion connected to the top portions, and a flange portion protruding from the side portion, the flange of the gate conductor layer is disposed on and parallel to the flange of the gate conductor layer, a flat surface of the flange of the gate conductor layer is disposed on the slightly doped region, and the gate insulator layer and the gate conductor layer form an omega ($\Omega$) sectional shape.

10. The memory of claim 9, wherein the metal cap covering the gate conductor layer.

11. The memory of claim 9, wherein the metal cap disposed only on a top surface of the gate structure.

12. The memory of claim 9, wherein a material for the metal cap includes Tungsten (W) and a material for the channel layer and the gate conductor layer includes poly silicon.

13. The memory of claim 9, wherein the source region comprises a heavily doped region and a lightly doped region and the drain region comprises a heavily doped region and a lightly doped region.

14. The memory of claim 9, wherein the capacitor comprising:
   a storage layer disposed on the surface of the insulator layer;
   a barrier layer disposed on the storage layer; and
   a reference layer disposed on the barrier layer.

15. The memory of claim 9, wherein a punch through barrier is formed between the lightly doped region of the source region and the lightly doped region of the drain region; the punch through barrier is a doped region within the substrate that has a dope type different from the lightly doped region of the source region and the lightly doped region of the drain region.

16. The memory of claim 15, wherein the punch through barrier is further formed within the channel extension anchor.

17. The memory of claim 9, wherein ends of the gate insulator layer and the gate conductor layer is aligned with each other; the ends of the gate insulator layer and the gate conductor layer marks the area on the substrate where a periphery of the heavily doped region of the source region and the heavily doped region of the drain region is formed.

* * * * *